(12) United States Patent
Reznik

(10) Patent No.: US 7,519,520 B2
(45) Date of Patent: Apr. 14, 2009

(54) COMPACT SIGNAL CODING METHOD AND APPARATUS

(75) Inventor: Yuriy A. Reznik, Seattle, WA (US)

(73) Assignee: RealNetworks, Inc., Seattle, WA (US)

( * ) Notice: Subject to any disclaimer, the term of this patent is extended or adjusted under 35 U.S.C. 154(b) by 576 days.

(21) Appl. No.: 10/964,856

(22) Filed: Oct. 13, 2004

(65) Prior Publication Data

US 2005/0080829 A1 Apr. 14, 2005

Related U.S. Application Data

(60) Provisional application No. 60/511,155, filed on Oct. 13, 2003.

(51) Int. Cl.
*G06F 17/10* (2006.01)
*G10L 21/00* (2006.01)

(52) U.S. Cl. .............. 703/2; 725/90; 725/91; 704/500; 704/503

(58) Field of Classification Search .............. 703/2; 725/87, 118, 90, 91; 704/201, 214, 230, 704/229, 503, 500; 341/76, 110
See application file for complete search history.

(56) References Cited

U.S. PATENT DOCUMENTS

| | | | |
|---|---|---|---|
| 5,872,531 A * | 2/1999 | Johnson et al. | 341/110 |
| 6,253,165 B1 * | 6/2001 | Malvar | 703/2 |
| 6,256,608 B1 * | 7/2001 | Malvar | 704/230 |
| 6,314,391 B1 * | 11/2001 | Tsutsui et al. | 704/214 |
| 6,995,699 B2 * | 2/2006 | Toyama et al. | 341/76 |
| 7,212,973 B2 * | 5/2007 | Toyama et al. | 704/500 |
| 2004/0039568 A1 * | 2/2004 | Toyama et al. | 704/229 |

OTHER PUBLICATIONS

Haskell et al., B.G. Audio and Video Bit-Rate Reduction, Proceedings of the IEEE, vol. 69, No. 2, Feb. 1981, pp. 252-262.*
Kretz et al., F. Digital Television: Transmission and Coding, Proceedings of the IEEE, vol. 73, Apr. 1985, pp. 575-591.*
Netravali et al., A.N. Quantization of Color Signals, Proceedings of the IEEE, vol. 65, No. 8, Aug. 1977, pp. 1177-1187.*
Netravali et al., A.N. Adaptive Quantization of Picture Signals Using Spatial Masking, Proceedings of the IEEE, vol. 65, No. 4, Apr. 1977, pp. 536-551.*
Haskell et al., B.G., Audio and Video Bit-Rate Reduction, Proceedings of the IEEE, Feb. 1981, pp. 252-262, vol. 69, No. 2.
Kretz et al., F., Digital Television: Transmission and Coding, Proceedings of the IEEE, Apr. 1985, pp. 575-591, vol. 73.
Written Opinion of the International Searching Authority, PCT Application No. PCT/US04/33917, Filed Oct. 13, 2004, Applicant RealNetworks, Inc.

* cited by examiner

*Primary Examiner*—Russell Frejd
(74) *Attorney, Agent, or Firm*—Adam L. K. Philipp; Axios Law Group, PLLC

(57) ABSTRACT

A compact signal coding method and apparatus including obtaining cumulative probabilities for successive quantized samples of a signal, determine the direct probability for the leading one of the successive quantized samples, and encode the quantized sample based at least in part on the determined direct probability.

38 Claims, 4 Drawing Sheets

COMPACT SIGNAL CODING METHOD AND APPARATUS

RELATED APPLICATION

This application is a non-provisional application of provisional application No. 60/511,155, filed on Oct. 13, 2003, entitled "Coding Signals with Nested Monotonic Distribution"; claims by priority to said '155 provisional application, and incorporates its specification in entirety by reference.

TECHNICAL FIELD

Embodiments of the present invention are related to the field of encoding of digital signals. More specifically, embodiments of the present invention are related to audio, video and image signal coding.

BACKGROUND

Advances in microprocessor and video related technologies have led to wide spread deployment and adoption of numerous types of audio, video and imaging devices. Examples of such devices include but are not limited to digital cameras, camcorders, MP3 players, digital versatile disk (DVD) players, video enabled laptop and desktop computing devices as well as servers, and so forth.

Advances in networking, telecommunication, satellite and other related technologies have also led to increase in on demand and/or real time online delivery of audio and video information, including delivery over public networks, such as the Internet.

Whether videos are delivered "offline" (e.g. from a directly coupled DVD player) or online (e.g. from a video server over a networking connection), high quality audio or video inherently requires a high volume of data. Thus, audio and video delivery and rendering often involve encoding and decoding to reduce the amount of data to be stored, retrieved and/or transmitted.

DETAILED DESCRIPTION OF ILLUSTRATIVE EMBODIMENTS

Figure 1:
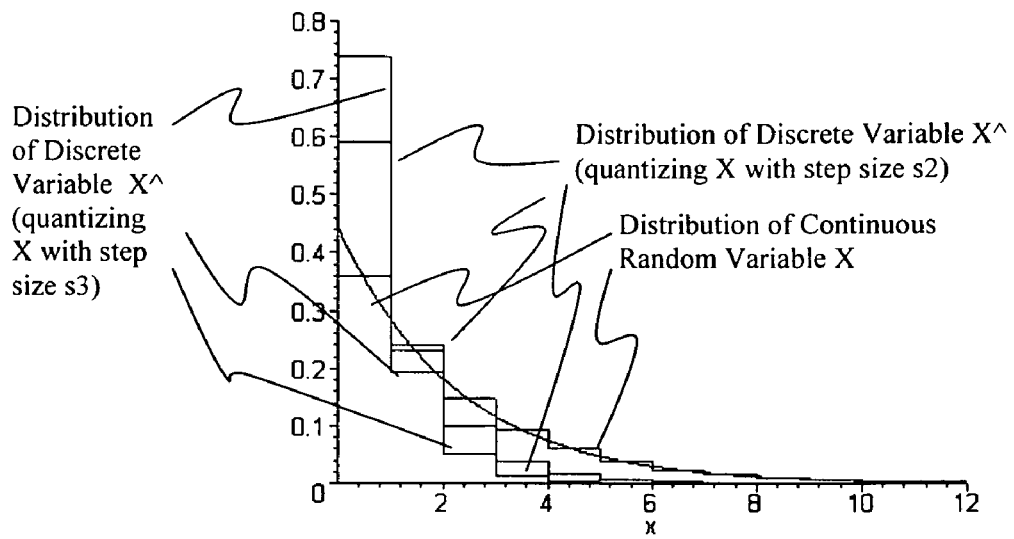
FIG. 1 illustrates a distribution of continuous random variable x and discrete variables $X^\Delta$ (depicted as $X\hat{}$ in the drawing) produced by quantizing X with different quantization steps sizes.

Embodiments of the present invention includes a video encoder, a complementary decoder, devices equipped with these encoders and/or decoders, systems made up of such devices, and methods of operations of these elements, devices and systems, and related subject matters.

Preliminary Considerations

To illustrate embodiments of the present invention, consider a continuous random variable X with density f(x). For simplicity, it will be assumed that f(x)=0 if x<0, and that f(x) is monotonically decreasing beyond that point:

$$\forall x, y : x \geq y \geq 0 \Rightarrow f(x) \leq f(y).$$

Using X a family of quantized discrete random variables $X^\Delta$ (also denoted as $X\hat{}$ in the drawing) may be obtained:

$$X^\Delta = i, \text{ if } i\Delta \leq X < (i+1)\Delta, i=0, 1, 2 \ldots,$$

where $\Delta=1, 2, 3, \ldots$ is the step size used to quantize X (denoted as $\hat{}$ in the drawing).

The probability that $X^\Delta = i$ is:

$$p_i^\Delta = \int_{i\Delta}^{(i+1)\Delta} f(x) dx.$$

Illustrated in FIG. 1 are examples of such distributions of continuous random variable X, and discrete variables $X^\Delta$ ($x\hat{}$ in the drawing) produced by quantizing X with different quantization steps sizes.

Considering formula for $p_i^\Delta$, it has been noticed that $$p_i^2 = p_{2i}^1 + p_{2i+1}^1$$

$$p_i^3 = p_{3i}^1 + p_{3i+1}^1 + p_{3i+2}^1$$

$$\ldots$$

$$p_i^\Delta = p_{\Delta i}^1 + p_{\Delta i+1}^1 + \ldots + p_{\Delta i+\Delta-1}^1$$

and for this reason, $\{\{p_i^\Delta\}, \Delta=2, 3 \ldots\}$ will be referred to as nested distributions of the distribution $\{p_i^1\}$ (corresponding to a quantization step size $\Delta=1$).

Then, the cumulative probabilities $s_i^\Delta = \Sigma_{j \geq i} p_j^\Delta$, based on the above observed properties, can be shown to be:

$$s_i^\Delta = \sum_{j=i}^{\infty} p_j^\Delta = \sum_{j=i\Delta}^{\infty} p_j^1 = s_{i\Delta}^1.$$

In other words, all cumulative distributions for quantization step sizes $\Delta=2, 3, \ldots$ can be obtained by sub-sampling the cumulative probability distribution for $\Delta=1: \{s_i^1\}$. In fact, $\{s_i^1\}$ can also be obtained by sampling the original (continuous) distribution $$F(x) = \int_x^{\infty} f(u) du.$$

Figure 2:
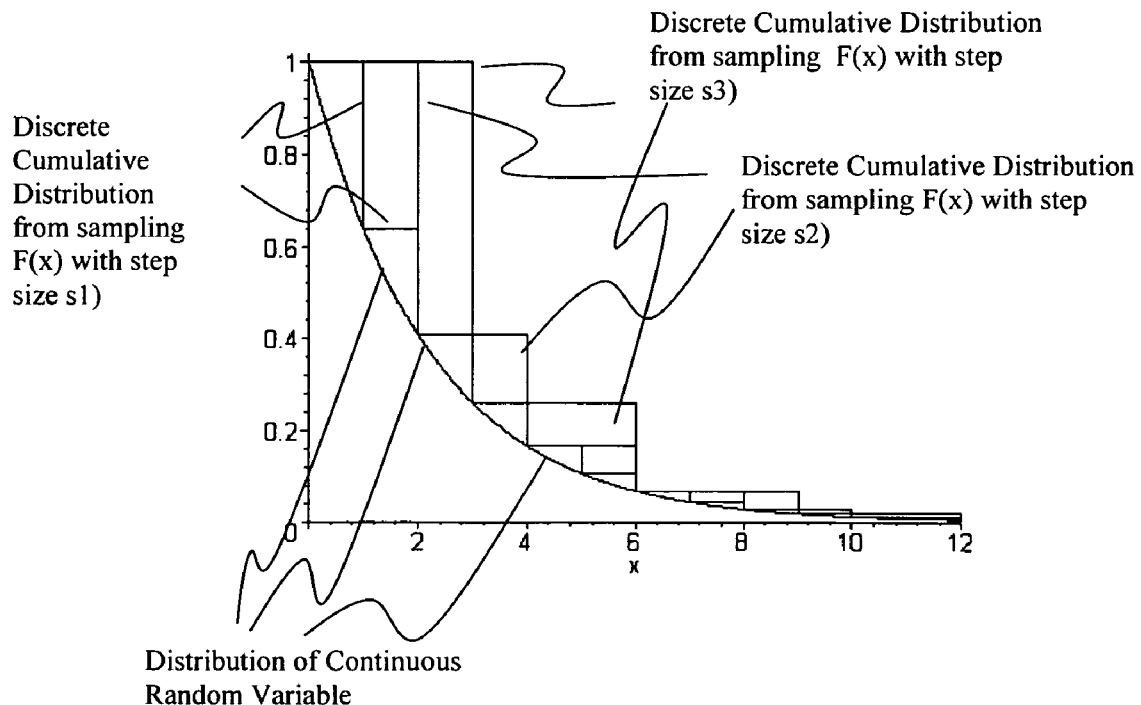
FIG. 2 illustrates a distribution function F(x) for continuous random variable X and discrete cumulative distributions produced by sampling F(x) with different quantization steps sizes.

FIG. 2 illustrates examples of distribution function F(x) for continuous random variable X, and discrete cumulative distributions produced by sampling F(x) with different quantization steps sizes.

Therefore, if a table containing values $\{s_i^1\}$ is maintained, the cumulative probabilities $\{s_i^\Delta\}$ can be accessed from the table, for all possible nested distributions with quantization step sizes $\Delta=2, 3, \ldots$ by simply multiplying indices $s_i^\Delta = s_{i\Delta}^1$, and direct (non-cumulative) probabilities can also be obtained for all these distributions by simply subtracting two adjacent values in $\{s_i^1\}$:

$$p_i^\Delta = s_i^\Delta - s_{i+1}^\Delta = s_{i\Delta}^1 - s_{(i+1)\Delta}^1.$$

In other words, in various embodiments, codes may be constructed for all possible nested distributions using only one table with cumulative probabilities $\{s_i^1\}$.

Applying to Signal Coding

The problem of coding of signals with nested monotonic distributions frequently arises in the design of lossy and lossless compression algorithms dealing with data produced by natural (analog) processes.

For example, in modern video- and image-compression algorithms such data are produced as a result of scalar quantization of DCT-transform coefficients (DCT=discrete cosine transform). In these cases, quantization parameter $\Delta$ is given explicitly (transmitted in the bitstream), and it can fluctuate from one group of transform coefficients to another based e.g. on the rate control logic.

In speech or LPC-based audio compression such data are produced by applying linear prediction to the input signal (LPC=linear predictive coding). The residual samples in these cases tend to have Laplacian distribution, but the variance of this distribution fluctuates very significantly from one frame of samples to another. By removing the sign of the residuals (e.g. by using transformation:

$$x^+ = \begin{bmatrix} 2x, \text{ if } x \geq 0, \\ -2x-1, \text{ if } x < 0 \end{bmatrix}$$

and normalizing them such that quantization step size $\Delta=1$ would correspond to the maximum variance, the same problem is arrived as it was originally described.

In all such cases, the standard techniques for coding of data with nested monotonic distributions have generally been either:

(i) Disregarding the fact that different quantization step sizes produce different distributions—and using a single "average" distribution, e.g. $\tilde{p}_i = \Sigma_{\Delta \geq 1} \alpha_\Delta p_i^\Delta$, ($\forall \Delta: 0 < \alpha_\Delta < 1$; $\Sigma_{\Delta \geq 1} \alpha_\Delta = 1$) for encoding of data. Obviously, this results in a substantial loss of compression efficiency. Examples of such approaches are: algorithms for coding of transform coefficients in standard video codecs: MPEG-1 ... 4, H.261, H.263.

(ii) Using multiple code tables corresponding to each possible distribution of various quantization step sizes $\Delta=1, 2, 3, \ldots$. This technique achieves maximum compression efficiency but requires a lot of memory (since it needs to store code tables for all distributions) making it difficult to implement on memory-limited (e.g. embedded) platforms. Examples of such approaches are: algorithms for coding of transform coefficients in RealNetworks' RV8 and RV9 video codecs.

(iii) Using special Golomb or Golomb-Rice codes—these techniques are restricted to geometric distributions, and require per-sample encoding. This means that even under geometric distributions the redundancy of such codes will be relatively high compared to codes (e.g. Gilbert-Moore or arithmetic codes) constructed for blocks of samples. Examples of such approaches are: Golomb and Golomb-Rice codes are used in the lossless image coding standard JPEG-LS, and in an emerging standard for lossless audio compression MPEG-4 ALS.

In various embodiments, a method of encoding of signals with nested monotonic distributions is practiced as follows:

uses as little as one table (if desired) containing cumulative probabilities $\{s_i^1\}$;

achieves increased efficiency of encoding of all nested distributions with quantization step sizes $\Delta=1, 2, 3, \ldots$;

enables construction of block codes, such as Gilbert-Moore (arithmetic) codes.

As those skilled in the art would appreciate, the method has the good properties of currently known algorithms, but substantially without inheriting any of the bad ones.

One embodiment (quantization step size d=1) of the encoding algorithm (in other embodiments, d may be equal to integer values other than 1):

Input parameters:

(i) an array of samples to be compressed $x_i, \ldots, x_N$; these samples can assume non-negative integer values, and are assumed to be interdependent identically distributed variable according to one of the nested distributions in the set $\{\{p_i^\Delta\}, \Delta=1, 2, 3 \ldots\}$, and (ii) parameter $\Delta$ (quantization step size) indicating which specific distribution we should use for encoding of a block.

The algorithm also uses:

a table s_freq[] containing cumulative probabilities $\{s_i^1\}$ corresponding to $\{p_i^1\}$ (the cumulative probability distribution may be a known cumulative probability distribution of the signal or an estimated cumulative probability distribution of the signal);

The main logic of the algorithm is as follows:

For each sample $x_i$, i=1 ... N do the following:

a. obtain the cumulative probabilities $s_{x_i}^\Delta = s_{x_i\Delta}^1 = $ s_freq $[x_i * \Delta]$ and $s_{x_i+1}^\Delta = s_{(x_i+1)\Delta}^1 = $ s_freq$[(x_i+1)*\Delta]$ b. obtain direct probability of $x_i$:

$$p_{x_i}^\Delta = s_{x_i\Delta}^1 - s_{(x_i+1)\Delta}^1 = s\_freq[x_i * \Delta] - s\_freq[(x_i+1) * \Delta]$$

c. construct prefix code for $x_i$ using $p_{x_i}^\Delta$ and $s_{x_i}^\Delta$.

Alternate Embodiments:

Operation (c) of the above algorithm may be implemented using Shannon code.

Operation (c) of the above algorithm may be implemented using Gilbert-Moore code.

Operation (c) of the above algorithm may be implemented using arithmetic (block Gilbert-Moore) code.

Shannon code may be constructed directly by taking $\lceil \log_2 (1/p_{x_i}^\Delta) \rceil$ most significant bits from binary representation of $s_{x_i}^\Delta$.

Gilbert-Moore code may be constructed by taking $\lceil \log_2 (1/p_{x_i}^\Delta) \rceil + 1$ most significant bits in binary representation $$\text{of } s_{x_i}^\Delta - \frac{1}{2} p_{x_i}^\Delta.$$

Example of an implementation of arithmetic (block Gilbert-Moore) code is presented in Appendix A.

Decoder

A decoder that operates in the inverse manner may be employed to decoded signals encoded in accordance with the earlier description. For example, for the prefix code embodiment, the decoder will decode the codes, by performing an inverse operation on the codes based on the fact they are generated based on $p_{x_i}^\Delta$ and $s_{x_i}^\Delta$. For the Shannon code embodiment, the decoder will decode the codes, by performing an inverse operation on the codes based on the fact they are generated using $\lceil \log_2 (1/p_{x_i}^\Delta) \rceil$ most significant bits from the binary representation of $s_{x_i}^\Delta$. For Gilbert-Moore code embodiment, the decoder will decode the codes, by perform ing an inverse operation on the codes based on the fact they are generated using $\lceil \log_2 (1/p_{x_i}^\Delta) \rceil + 1$ most significant bits of the binary representation of $$s_{x_i}^\Delta - \frac{1}{2} p_{x_i}^\Delta.$$

System

Figure 3:
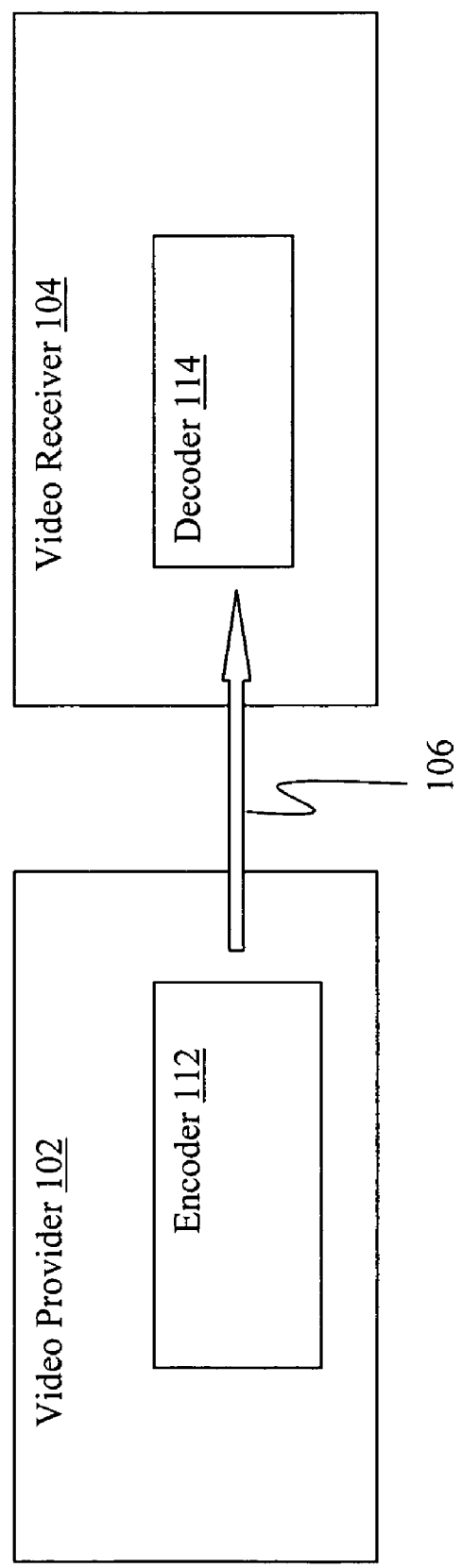
FIG. 3 illustrates an example system having a video sender device and a video receiver device incorporated with teachings of the present invention, in accordance with one embodiment.

FIG. 3 illustrates an overview of an example system incorporated with teachings of the present invention, in accordance with one embodiment. As illustrated, for the embodiment, example system 100 includes video sender 102 and video receiver 104 communicatively coupled to each other as shown. Video sender 102 includes in particular encoder 112, while video receiver 104 includes in particular decoder 114.

Video sender 102 provides encoded video to video receiver 104, using encoder 112 to encode the video. Further, encoder 112 advantageously includes hardware and/or software components incorporated with the teachings of the present invention.

Video receiver 104 receives the encoded video, decodes the video using decoder 114, and renders the decoded video for consumption by one or more users of video receiver 104. Further, decoder 114 advantageously includes hardware and/or software components incorporated with the teachings of the present invention. Accordingly, video receiver 104 may also be referred to as a video renderer. For the purpose of the present application, the two terms may be considered interchangeable, unless the context clearly indicates to the contrary.

For the purpose of the present application, as described earlier, a slice of a video is an integer number of macroblocks of a video. A video includes a number of pictures, each including a number of fields or frames, with each field or frame including a number of slices of macroblocks. Each macroblock includes a number of blocks of pixels.

Except for the fact that encoder 112 and decoder 114 are advantageously provided with hardware and/or software components adapted to encode and decode signals in accordance with an embodiment of the present invention, video server 102, including encoder 112, and video receiver 104, including decoder 114, represent a broad range of these elements known in the art or to be designed. Different embodiments may employ different implementations of these elements.

Further, video server 102 and video receiver 104 may be communicatively coupled to each other via any one of a number of wire based and/or wireless connections. For examples, the connection may be a bus connection (such as a Universal Serial Bus connection) or a wired local area network connection (such as an Ethernet connection). As a further example, the connection may also be a combined wireless and wired wide area network connection (such as a TMDA wireless connection between video sender 102 or video receiver 104 and a base station at one end, and a wire based ATM connection from the base station to the other end). [TDMA=Time Division Multiple Access, and ATM=Asynchronous Transfer Mode.]

Example Embodiments Including Encoder 112 and/or Decoder 114 of FIG. 3

Figure 4A:
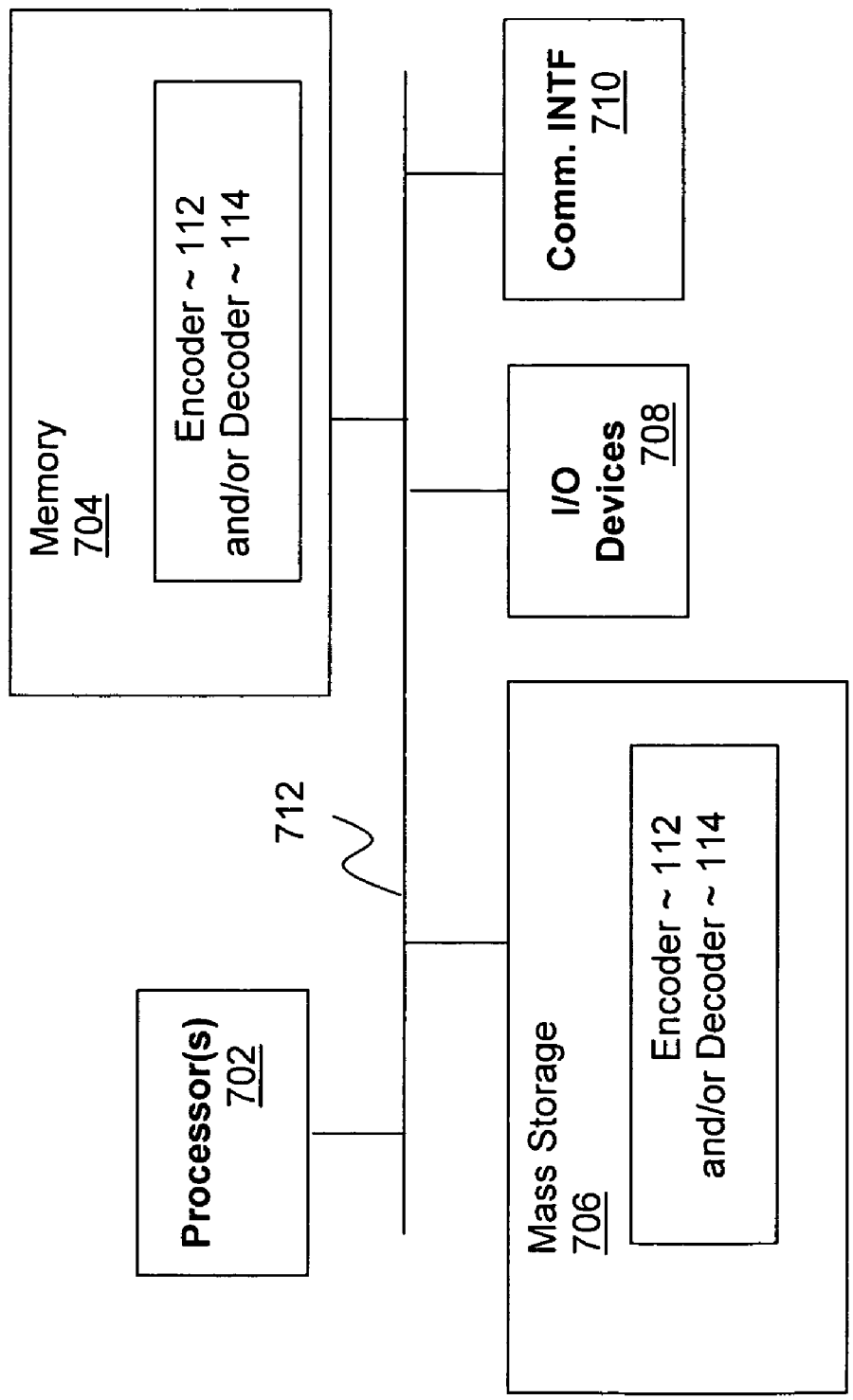
FIGS. 4a-4c illustrate various embodiments of the present invention.
Figure 4C:
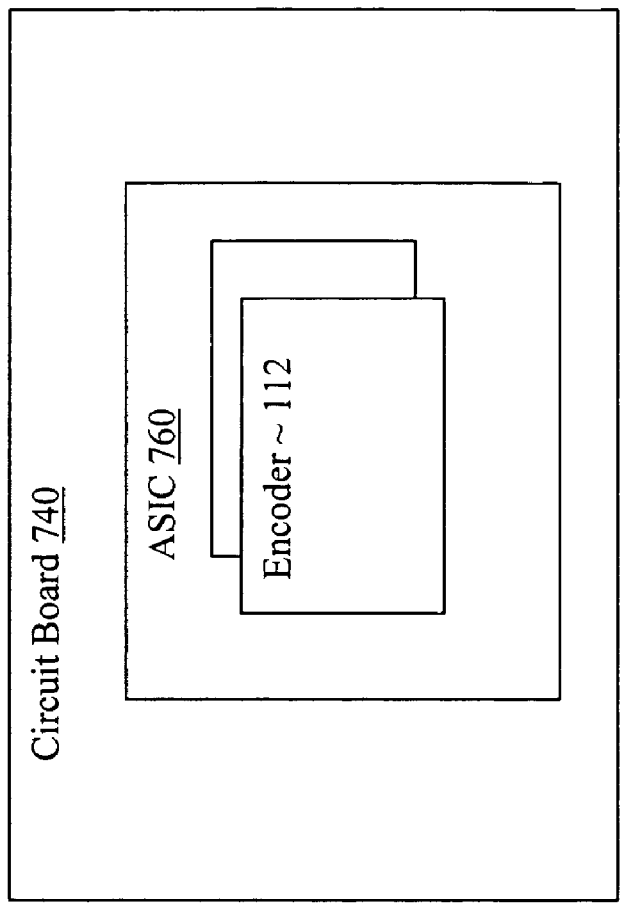
Figure 4B:
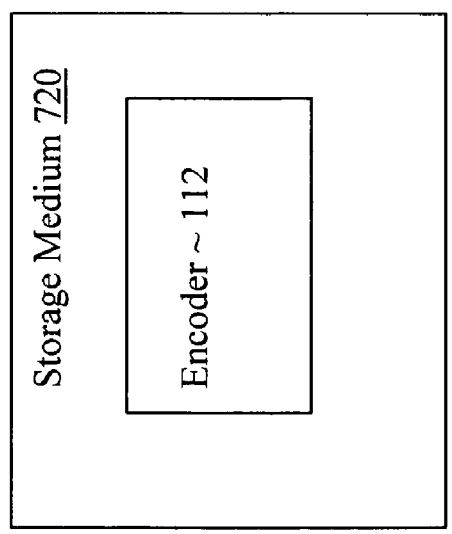

FIGS. 4a-4c illustrate various embodiments incorporated with encoder 112 and/or decoder 114 of FIG. 3. More specifically, FIG. 4a illustrates an example digital system incorporated with a software implementation of encoder 112. For the embodiment, example digital system 700 includes processor 702, memory 704, mass storage 706, I/O devices 708, and communication interface 710 coupled to each other and bus 712 as shown.

Memory 704 and mass storage 706 may be employed to store a working and a persistent copy of a software implementation of encoder 112 and/or decoder 114. Except for its usage, memory 704 and mass storage 706 may respectively be any one of a number of storage elements known in the art or to be designed.

Processor 702, I/O devices 708, communication interface 710 and bus 712 represent a broad range of the respective elements known in the art or to be designed.

In various embodiments, digital system 700 may be a wireless mobile phone, a personal digital assistant, a palm-sized computing device, a laptop computing device, a tablet computing device, a desktop computing device, a set top box, a server, an entertainment unit, a DVD player, a digital camera, a television, a display monitor, and other computing devices of the like.

FIG. 4b illustrates an article of manufacture having storage medium 720 and a software implementation of encoder 112 and/or decoder 114 stored therein. Stored encoder 112 may be employed to program and enable an apparatus to parallel decode encoded video as earlier described. The apparatus may e.g. be digital system 700 of FIG. 4a.

In various embodiments, article 720 may e.g. be a diskette, a compact disk (CD), a DVD (digital versatile disk) or other computer readable medium of the like. In other embodiments, article 720 may be a distribution server distributing encoder 112 and/or decoder 114 on line, via private and/or public networks, such as the Internet. In one embodiment, article 720 is a web server.

FIG. 4c illustrates a circuit board embodiment, where circuit board 740 includes an ASIC 760 having a number of hardware implementations of an encoding and/or decoder unit. ASIC 760 may be employed to form e.g. a DVD player, a digital camera, an entertainment unit, a set-top box and so forth.

In alternate embodiments, the encoding units may be disposed in multiple ASICs 760 instead.

Conclusion

While the present invention has been described with the above illustrative embodiments, including the example video system of FIG. 3, and various embodiments of the video encoder and/or decoder of FIGS. 4a-4c. The invention is not so limited, in particular, it is not limited to video applications. The invention may be practiced for audio signals, image signals, and other media signals of the like. In other words, it may be incorporated in other single, mixed and/or multi media sub-components, components and systems.

Appendix A—Example of an Implementation (Arithmetic Codes Using Nested Monotonic Distributions)

C-language implementation of arithmetic encoding functions:

```
#define FREQ_BITS     14         // # bits used by freq.
counters
#define VALUE_BITS    18         // # bits used to describe
code range
#define TOP_VALUE     0x3FFFF    // largest code value
#define FIRST_QTR     0x10000    // first quarter
#define HALF          0x20000    // first half
#define THIRD_QTR     0x30000    // third quarter
// encoder state variables:
static unsigned int high, low, bits_to_follow;
```

```
// start encoding:
void bgmc__start__encoding (void)
{
  high = TOP__VALUE;
  low = 0;
  bits__to__follow = 0;
}
// sends a bit followed by a sequence of opposite bits:
void put__bit__plus__follow (unsigned int bit)
{
  put__bit (bit);
  while (bits__to__follow) {
    put__bit (bit ^ 1);
    bits__to__follow --;
  }
}
// encodes a symbol using Gilbert-Moore code for
// a distribution s__freq[ ] sampled by delta:
void bgmc__encode (unsigned int symbol, int delta, unsigned
int *s__freq)
{
  unsigned int range = high −low +1;
  high=low+((range*s__freq[symbol*delta]−
(1<<FREQ__BITS))>>FREQ__BITS);
  low =low+((range*s__freq[(symbol+1)*delta])>>FREQ__BITS);
  for ( ; ; ) {
    if (high < HALF) {
      put__bit__plus__follow (0, p);
    } else if (low >= HALF) {
      put__bit__plus__follow (1, p);
      low -= HALF;
      high -= HALF;
    } else if (low >= FIRST__QTR &&high < THIRD__QTR) {
      bits__to__follow += 1;
      low -= FIRST__QTR;
      high -= FIRST__QTR;
    } else
      break;
    low = 2 * low;
    high = 2 * high + 1;
  }
}
// Finish the encoding:
static void bgmc__finish__encoding ( )
{
  bits__to__follow += 1;
  if (low < FIRST__QTR)    put__bit__plus__follow (0,p);
  else                     put__bit__plus__follow (1,p);
}
```

C-language implementation of the decoder functions:

```
// decoder state variables:
static unsigned int high, low, value;
// start decoding:
void bgmc__start__decoding (void)
{
  high = TOP__VALUE;
  low = 0;
  value = get__bits(VALUE__BITS);
}
// decodes a symbol using Gilbert-Moore code for
// a distribution s__freq[ ] sampled by delta:
unsigned int bgmc__decode (int delta, unsigned int *s__freq)
{
  unsigned int range, target, symbol;
  range = high − low + 1;
  target = (((value 12 − low + 1) << FREQ__BITS) − 1) /
range;
  for (symbol=0; s__freq[(symbol+1)*delta] > target;
symbol ++);
  high=low+((range*s__freq[symbol*delta]−
(1<<FREQ__BITS))>>FREQ__BITS);
  low =low+((range*s__freq[(symbol+1)*delta])>>FREQ__BITS);
  for ( ; ; ) {
    if (high < HALF) ;
    else if (low >= HALF) {
      value -= HALF;
      low   -= HALF;
      high  -= HALF;
    } else if (low >= FIRST__QTR &&high < THIRD__QTR) {
      value -= FIRST__QTR;
      low   -= FIRST__QTR;
      high  -= FIRST__QTR;
    } else
      break;
    low = 2 * low;
    high = 2 * high + 1;
    value = 2 * value + get__bit ( );
  }
  return symbol;
}
// Finish decoding:
void bgmc__finish__decoding ( )
{
  scroll__bits__back(VALUE__BITS−2);
}
```

What is claimed is:

1. A computer-implemented method of encoding data, the method comprising:
   obtaining, in a computer, a first cumulative probability for a quantized sample of a signal to be greater than or equal to a quantized sample $x_i$ of the signal;
   obtaining a second cumulative probability for a quantized sample of the signal to be greater than or equal to a quantized sample $x_i+1$;
   computing a direct probability for the quantized sample $x_i$ of the signal, using the obtained first and second cumulative probabilities; and
   encoding the quantized sample $x_i$ of the signal, based at least in part on the computed direct probability for the quantized sample $x_i$ of the signal to produce a decodable representation of the data.

2. The method of claim 1, wherein at least one of said obtaining is based at least in part on a selected one from a group consisting of a known cumulative probability distribution for the signal, and an estimated cumulative probability distribution for the signal.

3. The method of claim 1, wherein the obtaining of the first cumulative probability comprises obtaining the first cumulative probability by sub-sampling a cumulative probability distribution for a quantized sample of the signal being greater than or equal to $x_i$, when the signal is quantized with a first quantization step size, the cumulative probability being nested monotonic.

4. The method of claim 1, wherein the obtaining comprises retrieving the first cumulative probability from a table having a cumulative probability for a quantized sample of the signal to be greater than or equal to $x_i$, when the signal is quantized with a first quantization step size, the cumulative probability being nested monotonic.

5. The method of claim 4, wherein the method further comprises receiving the first quantization step size.

6. The method of claim 1, wherein the computing comprises computing a difference between the obtained first and second cumulative probabilities.

7. The method of claim 1, wherein the encoding comprises generating a prefix code for the quantized sample $x_i$ of the signal, based at least in part on the computed direct probability for the quantized sample $x_i$ of the signal.

8. method of claim 7, wherein the generating is further based on the first cumulative probability.

9. The method of claim 8, wherein the generating comprises selecting a number of most significant bits from a binary representation of the first cumulative probability, the number being dependent on the determined direct probability.

10. The method of claim 9, wherein the generating comprises selecting a number of most significant bits from a binary representation of a difference between the first cumulative probability and the determined direct probability, the number being dependent on the determined direct probability.

11. The method of claim 1, wherein the encoding comprises generating a Shannon code for the quantized sample $x_i$ of the signal, based at least in part on the computed direct probability for the quantized sample $x_i$ of the signal.

12. The method of claim 1, wherein the encoding comprises generating a Gilbert-Moore code for the quantized sample $x_i$ of the signal, based at least in part on the computed direct probability for the quantized sample $x_i$ of the signal.

13. The method of claim 1, wherein the method further comprises selecting the quantized sample $x_i$ of the signal.

14. The method of claim 13, wherein the method further comprises receiving a plurality of quantized samples of the signal, and the quantized sample $x_i$ of the signal is selected from the received plurality of quantized samples of the signal.

15. The method of claim 14, wherein the method further comprises repeating the selecting, the two obtaining, the computing and the generating for another quantized sample $x_i$ of the signal selected from the received plurality of quantized samples of the signal.

16. The method of claim 1, wherein the signal is selected from the group consisting of a video signal, an image signal, and an audio signal.

17. An encoder to encode data, the encoder comprising:
a storage medium having stored therein a plurality of programming instructions, which when executed enable the encoder to:
obtain a first cumulative probability for a quantized sample of a signal to be greater than or equal to a quantized sample $x_i$ of the signal,
obtain a second cumulative probability for a quantized sample of the signal to be greater than or equal to a quantized sample $x_i+1$,
compute a direct probability for the quantized sample $x_i$ of the signal, using the obtained first and second cumulative probabilities, and
encode the quantized sample $x_i$ of the signal, based at least in part on the computed direct probability for the quantized sample $x_i$ of the signal to produce a decodable representation of the data; and
at least one processor coupled to the storage medium to execute the plurality of programming instructions.

18. The encoder of claim 17, wherein at least one of said obtainings of a cumulative probability for a quantized sample of the signal is based at least in part on a selected one from the group consisting of a known cumulative probability distribution of the signal, and an estimated probability distribution of the signal.

19. The encoder of claim 17, wherein the storage medium further comprises a table having a cumulative probability for a quantized sample $x_i$ of the signal to be greater than or equal to $x_i$, when the signal is quantized with a first quantization step size, the cumulative probability being nested monotonic.

20. The encoder of claim 17, wherein the plurality of programming instructions are operative to perform the computing by computing a difference between the obtained first and second cumulative probabilities.

21. The encoder of claim 17, wherein the plurality of programming instructions are operative to perform the encoding by generating a prefix code for the quantized sample $x_i$ of the signal, based at least in part on the computed direct probability for the quantized sample $x_i$ of the signal.

22. The encoder of claim 17, wherein the plurality of programming instructions are operative to perform the encoding by generating a Shannon code for the quantized sample $x_i$ of the signal, based at least in part on the computed direct probability for the quantized sample $x_i$ of the signal.

23. The encoder of claim 17, wherein the plurality of programming instructions are operative to perform the encoding by generating a Gilbert-Moore code for the quantized sample $x_i$ of the signal, based at least in part on the computed direct probability for the quantized sample $x_i$ of the signal.

24. An encoder, coupled to a system, to encode data, the encoder comprising:
means for obtaining a first cumulative probability for a quantized sample of a signal to be greater than or equal to a quantized sample $x_i$ of the signal;
means for obtaining a second cumulative probability for a quantized sample of the signal to be greater than or equal to a quantized sample $x_i+1$;
means for computing a direct probability for the quantized sample $x_i$ of the signal, using the obtained first and second cumulative probabilities; and
means for encoding the quantized sample $x_i$ of the signal, based at least in part on the computed direct probability for the quantized sample $x_i$ of the signal to produce a decodable representation of the data.

25. The encoder of claim 24, wherein at least one of said means for obtaining is operative to perform the obtaining based at least in part on a selected one from the group consisting of a known cumulative probability distribution of the signal, and an estimated cumulative probability distribution of the signal.

26. The encoder of claim 24, wherein the encoder further comprises means for storing a table having a cumulative probability for a quantized sample of the signal to be greater than or equal to $x_i$, when the signal is quantized with a first quantization step size, the cumulative probability being nested monotonic.

27. A decoder, coupled to a system, to decode encoded data, the decoder comprising:
means for receiving an encoded quantized sample $x_i$ of a signal;
means for decoding the encoded quantized sample $x_i$ of the signal by performing an inverse operation on the encoded quantized sample $x_i$ of the signal, based at least in part on a direct probability for the encoded quantized sample $x_i$ of the signal; and
means for rendering the decoded sample.

28. The decoder of claim 27, wherein the decoder is further operative to perform the inverse operation based on a cumulative probability for a quantized sample of the signal to be greater than or equal to the quantized sample $x_i$ of the signal.

29. The decoder of claim 27, wherein the decoder is further operative to perform the inverse operation based on the encoded quantized sample $x_i$ of the signal having been Shannon code generated, based at least in part on the computed direct probability for the quantized sample $x_i$ of the signal.

30. The encoder of claim 27, wherein the decoder is further operative to perform the inverse operation based on the encoded quantized sample $x_i$ of the signal having been Gilbert-Moore code generated, based at least in part on the computed direct probability for the quantized sample $x_i$ of the signal.

31. The decoder of claim 27, wherein the decoder further comprises means for storing a table having a cumulative probability for a quantized sample of the signal to be greater than or equal to $x_i$, when the signal is quantized with a first quantization step size, the cumulative probability being nested monotonic.

32. A system comprising:
an encoder operative to:
obtain a first cumulative probability for a quantized sample of a signal to be greater than or equal to a quantized sample $x_i$ of the signal,
obtain a second cumulative probability for a quantized sample of the signal to be greater than or equal to a quantized sample $x_i+1$,
compute a direct probability for the quantized sample $x_i$ of the signal, using the obtained first and second cumulative probabilities, and
encode the quantized sample $x_i$ of the signal, based at least in part on the computed direct probability for the quantized sample $x_i$ of the signal to produce a decodable representation of the data; and
a transmitter coupled to the encoder to transmit the decodable representation of the data.

33. The system of claim 32, wherein at least one of said obtainings of a cumulative probability for a quantized signal is based at least in part on a selected one from the group consisting of a known cumulative probability distribution of the signal, and an estimated cumulative probability distribution of the signal.

34. The system of claim 32, wherein the encoder further stores a table having a cumulative probability for a quantized sample of the signal to be greater than or equal to $x_i$, when the signal is quantized with a first quantization step size, the cumulative probability being nested monotonic.

35. The system of claim 32, wherein the system is selected from the group consisting of a palm sized computing device, a wireless mobile phone, a digital personal assistant, a set-top box, a digital versatile disk player, a television, and a display monitor.

36. A system comprising:
a receiver operative to receive an encoded quantized sample $x_i$ of a signal;
a decoder coupled to the receiver and operative to decode the received encoded quantized sample $x_i$ of the signal by performing an inverse operation on the encoded quantized sample $x_i$ of the signal, based at least in part on a direct probability for the quantized sample $x_i$ of the signal; and
a renderer coupled to the decoder to render the decoded quantized sample $x_i$ of the signal.

37. The system of claim 36, wherein the encoder is further operative to store a table having a cumulative probability for a quantized sample of the signal to be greater than or equal to $x_i$, when the signal is quantized with a first quantization step size, the cumulative probability being nested monotonic.

38. The system of claim 36, wherein the system is selected from the group consisting of a palm sized computing device, a wireless mobile phone, a digital personal assistant, a set-top box, a digital versatile disk player, a television, and a display monitor.

\* \* \* \* \*

UNITED STATES PATENT AND TRADEMARK OFFICE
CERTIFICATE OF CORRECTION

PATENT NO. : 7,519,520 B2  Page 1 of 1
APPLICATION NO. : 10/964856
DATED : April 14, 2009
INVENTOR(S) : Yuriy A. Reznik It is certified that error appears in the above-identified patent and that said Letters Patent is hereby corrected as shown below:

Column 7, line 60 "target = (((value 12 – low + 1) << FREQ_BITS) – 1) /..." should read --target = (((value – low + 1) << FREQ_BITS)-1) /...--.

Column 8, line 66 "method of claim 7, wherein the generating..." should be changed to --The method of claim 7, wherein the generating...--.

Signed and Sealed this

Seventh Day of July, 2009

JOHN DOLL
*Acting Director of the United States Patent and Trademark Office*